(12) United States Patent
Yan

(10) Patent No.: US 11,358,798 B2
(45) Date of Patent: Jun. 14, 2022

(54) DISPLAY PANEL CONVEYING SYSTEM AND CONVEYING METHOD

(71) Applicants: HKC CORPORATION LIMITED, Shenzhen (CN); CHONGQING HKC OPTOELECTRONICS TECHNOLOGY CO., LTD., Chongqing (CN)

(72) Inventor: Yirui Yan, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 764 days.

(21) Appl. No.: 16/314,862

(22) PCT Filed: Oct. 23, 2018

(86) PCT No.: PCT/CN2018/111302
§ 371 (c)(1),
(2) Date: Jan. 3, 2019

(87) PCT Pub. No.: WO2020/042306
PCT Pub. Date: Mar. 5, 2020

(65) Prior Publication Data
US 2021/0354928 A1  Nov. 18, 2021

(30) Foreign Application Priority Data
Aug. 31, 2018  (CN) .......................... 201811008488.7

(51) Int. Cl.
*B65G 17/16* (2006.01)
*B65G 47/06* (2006.01)
*B65G 49/05* (2006.01)
*H01L 21/677* (2006.01)

(52) U.S. Cl.
CPC ............. *B65G 17/16* (2013.01); *B65G 47/06* (2013.01); *B65G 49/05* (2013.01); *H01L 21/677* (2013.01)

(58) Field of Classification Search
CPC ........ B65G 17/16; B65G 47/06; B65G 49/05; H01L 21/677
See application file for complete search history.

(56) References Cited

U.S. PATENT DOCUMENTS

2017/0092520 A1* 3/2017 Kim ...................... H01L 23/544

FOREIGN PATENT DOCUMENTS

| CN | 1517747 A | 8/2004 | |
|---|---|---|---|
| CN | 1631751 A | 6/2005 | |
| CN | 1868837 A | 11/2006 | |
| CN | 101088893 A | 12/2007 | |
| CN | 101278384 A | 10/2008 | |
| CN | 106645768 * | 5/2017 | ............. G01N 35/02 |
| CN | 206497879 U | 9/2017 | |
| CN | 109095180 * | 12/2018 | ............. B65G 49/05 |
| JP | 2004203604 A | 7/2004 | |
| KR | 20120014101 A * | 2/2012 | ....... H01L 21/67706 |

OTHER PUBLICATIONS

Yang Zhang, the ISA written comments, May 2019, CN.

* cited by examiner

*Primary Examiner* — James R Bidwell

(57) ABSTRACT

The present application discloses a display panel conveying system and a conveying method. The display panel conveying system includes a cassette, a console, a crane, and a movable cassette conveying device, where the console has at least two sets.

15 Claims, 3 Drawing Sheets

```
A crane places a cassette on a conveying     s51
platform
                    ↓
The conveying platform conveys the cassette to   s52
a movable cassette conveying device
                    ↓
The movable conveying device stores the      s53
cassette on a console or storage space
```

DISPLAY PANEL CONVEYING SYSTEM AND CONVEYING METHOD

This application claims priority to Chinese Patent Application No. CN 201811008488.7, filed with the Chinese Patent Office on Aug. 31, 2018, and entitled "DISPLAY PANEL CONVEYING SYSTEM AND CONVEYING METHOD", which is incorporated herein by reference in its entirety.

TECHNICAL FIELD

This application relates to the field of display technologies, and more specifically, to a display panel conveying system and a conveying method.

BACKGROUND

Descriptions herein merely provide background information related to this application, and do not necessarily constitute the prior art.

Liquid crystal displays have many advantages, for example, a thin frame, power saving, and radiation free; and therefore, is widely applied. Most liquid crystal displays on the market are backlit liquid crystal displays that include a liquid crystal panel and a backlight module (Backlight Module). An operating principle of the liquid crystal panel is as follows: liquid crystal molecules are placed between two parallel glass substrates, and driving voltage is applied to the two glass substrates to control a rotation direction of the liquid crystal molecules. In this way, light from the backlight module is refracted, to generate a picture.

A complete set of automated carrying system is essential to a photoelectric panel factory. The automated carrying system is like blood of the entire factor and delivers to-be-processed display panels to each processing consoles. The display panels are generally placed in cassettes. A structure of a cassette conveying system affects the logistical capacity of the entire carrying system.

Currently, a port is designed at the underlying layer of a cassette storage and conveying device to connect to a console. In this way, the cassettes can be directly carried to the port and used by the console. When a console needs to be added, regular connection cannot be implemented in the conveying system: space is insufficient, and connection still cannot be implemented even after transformation. If a conveying system is added, high costs are incurred, a footprint is large, and construction is difficult.

SUMMARY

This application provides a display panel conveying system and a conveying method for connecting a console to a cassette storage and conveying device at low costs.

To achieve the foregoing purpose, this application provides a display panel conveying system, where conveying system includes:

a cassette, configured to store a display panel;

a console, configured to temporarily store the cassette, fetch the display panel from the cassette, and place the display panel on a next working platform;

a crane, configured to convey the cassette to the console; and a movable cassette conveying device, configured to fetch the cassette and place the cassette on the console, where the console has at least two sets.

Optionally, the display panel conveying system includes: a conveying platform, where the crane or the movable cassette conveying device fetches and conveys the cassette from the conveying platform or the crane carries the cassette to the conveying platform and the crane or the movable cassette conveying device conveys the cassette from the conveying platform to the console.

Optionally, the conveying platform includes a conveying apparatus, configured to convey the cassette to a feed inlet of the movable cassette conveying device.

The cassette can be conveyed to the movable cassette conveying device by using the conveying apparatus in the existing conveying platform. In this way, the cassette is transferred to the movable cassette conveying device without requiring adding a conveying channel.

Optionally, the display panel conveying system includes storage location space, configured to store the cassette, where the movable cassette conveying device may convey the cassette to the storage location space or the console.

The movable cassette conveying device may convey the cassette to the console for a next process, or may convey the cassette to the storage location space for storage. These two functions are provided, enabling high operability.

Optionally, the display panel conveying system includes a rail, where the movable cassette conveying device moves on the rail; and the movable cassette conveying device includes an overhead cassette conveyor, where the overhead cassette conveyor has only one layer of storage locations for storing the cassette.

The overhead cassette conveyor has only one layer of storage locations for storing the cassette. Usually, display panels are stored in a stacking manner in the cassette so that the cassette has a specific height. Space of the overhead cassette conveyor is limited and is insufficient for two or more layers of storage locations. Therefore, only one layer of storage location space is designed, to achieve a better moving effect. Moreover, generally, 30 layers of display panels may be stacked in the cassette. If cassettes are further stacked, fetching a display panel from a cassette by the console may be affected.

Optionally, the console includes:

a cassette placement platform, configured to temporarily store the cassette conveyed by the crane or the movable cassette conveying device; and a mechanical arm, configured to fetch a display panel from the cassette; where the console includes at least two cassette placement platforms.

The at least two cassette placement platforms can ensure that the cassette conveyed by the crane or the movable cassette conveying device can be stored on one cassette placement platform, and the mechanical arm can fetch a display panel from a cassette on the other cassette placement platform. The operations are performed synchronously, thereby improving working efficiency.

Optionally, the display panel conveying system includes a conveying platform, a rail, and storage location space, where the console includes a first console and a second console; the second console is located on two sides of the crane; the conveying platform, the crane, and the storage location space are located on one side of the rail; the conveying platform is located between the crane and the storage location space; the first console is located on the other side of the rail; the movable cassette conveying device is located on the rail; and the movable cassette conveying device conveys the cassette from the conveying platform to the first console.

The rail and the movable cassette conveying device are added on one side of the crane, the storage location space, and the conveying platform. When console space on two sides of the crane is full, a new console is added and a new conveying route is also provided, thereby increasing conveying and operation space for the cassette. The movable cassette conveying device is located between the console and conveying platform, so that the cassette can be moved more conveniently from the conveying platform to the console for a next operation.

This application further discloses a conveying method of a display panel conveying system, including the steps of:

placing a cassette on a conveying platform by a crane;

moving the cassette to a grabbing location of a movable cassette conveying device by the conveying platform; and storing the cassette on a console or storage location space by the movable conveying device.

The cassette is conveyed by the movable cassette conveying device. In this way, the cassette can be conveyed to a newly added console without requiring adding a conveying system. In addition, the newly added console can provide higher conveying efficiency. This saves costs, directly improves a speed of conveying the cassette, and indirectly improves working efficiency, thereby achieving advantages such as simple construction and a small footprint.

Optionally, the conveying method of the display panel conveying system includes: moving, by the conveying platform by using a conveying apparatus, the cassette to the movable cassette conveying device, where the movable cassette conveying device includes an overhead cassette conveyor.

The overhead cassette conveyor is mountable, and is implementable for this method. The overhead cassette conveyor does not affect a footprint of the display panel conveying system and has the advantage of low costs.

The inventor discovers during research that in a display panel conveying system known to the inventor, consoles connected to two sides of a crane cannot be connected to another console due to a limit of space; and when a console needs to be added, because the console cannot be directly connected to the conveying system, a new conveying system needs to be added. This results in relatively high operation costs. In addition, the new conveying system has a relatively large footprint, resulting in relatively high production costs. The applicant adds a movable cassette conveying device to convey the cassette, thereby adding a console. The newly added console can provide higher conveying efficiency without requiring adding a conveying system, thereby reducing costs and achieving advantages such as simple construction and a small footprint.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

Figure 1:
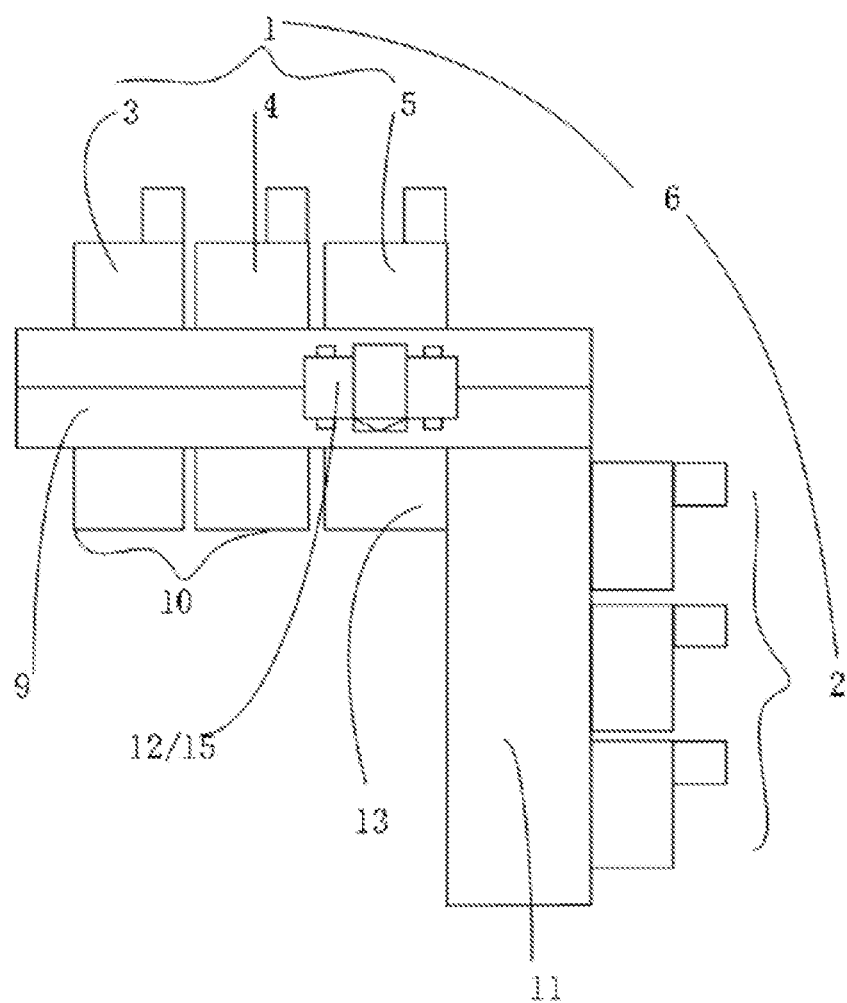
FIG. 1 is a schematic diagram of a conveying system according to an embodiment of the present application.
Figure 2:
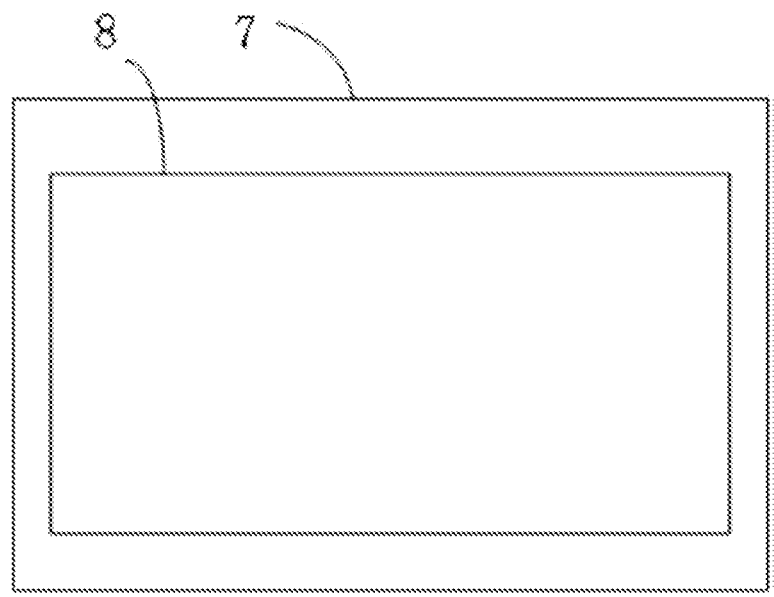
FIG. 2 is a schematic diagram of storing a display panel in a cassette according to an embodiment of the present application.
Figure 3:
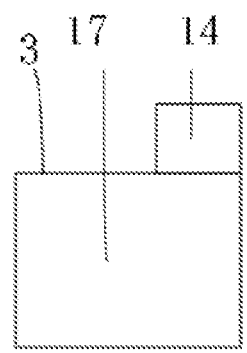
FIG. 3 is a schematic diagram of a first console according to an embodiment of the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying relative importance, or implicitly indicating the number of the indicated technical features. Hence, the features defined by "first" and "second" can explicitly or implicitly include one or more of features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", and "connected to" should be comprehended in a broad sense. For example, these terms may be comprehended as being fixedly connected, detachably connected or integrally connected; mechanically connected; electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

The present application is further described below in combination with the accompanying drawings and preferable embodiments.

As shown in FIG. 1 to FIG. 4, embodiments of the present application disclose a display panel conveying system, including:

a cassette 7, configured to store a display panel 8;

a console 6, configured to temporarily store the cassette 7, fetch the display panel 8 from the cassette 7, and place the display panel 8 on a next working platform;

a crane 11, configured to convey the cassette 7 to the console 6;

a movable cassette conveying device 12, configured to fetch the cassette 7 and place the cassette 7 on the console 6;

a conveying platform 13, where the crane 11 or the movable cassette conveying device 12 fetches and conveys the cassette 7 from the conveying platform 13;

storage location space 10, configured to store the cassette 7; and a rail 9, where the movable cassette conveying device 12 moves on the rail 9, where the console 6 includes a first console 1 and a second console 2;

the first console 1 includes a first cassette placement platform 3, a second cassette placement platform 4, and a third cassette placement platform 5;

the second console 2 is located on two sides of the crane 11; the conveying platform 13, the crane 11, and the storage location space 10 are located on one side of the rail 9; the conveying platform 13 is located between the crane 11 and the storage location space 10; the first console 1 is located on the other side of the rail 9; and the movable cassette conveying device 12 is located on the rail 9; and the conveying platform 13 includes a conveying apparatus 16, configured to convey the cassette 7 to a feed inlet of the movable cassette conveying device 12.

In another embodiment of the present application, as shown in FIG. 1 to FIG. 4, a display panel conveying system is disclosed, including:

a cassette 7, configured to store the display panel 8;

a console 6, configured to temporarily store the cassette 7, fetch the display panel 8 from the cassette 7, and place the display panel 8 on a next working platform;

a crane 11, configured to convey the cassette 7 to the console 6; and a movable cassette conveying device 12, configured to fetch the cassette 7 and place the cassette 7 on the console 6, where the console 6 has at least two sets.

In a display panel conveying system known to the inventor, consoles 6 connected to two sides of a crane 11 cannot be connected to another console 6 due to a limit of space; and when a console 6 needs to be added, because the console 6 cannot be directly connected to the conveying system, a new conveying system needs to be added. This results in relatively high operation costs. In addition, the new conveying system has a relatively large footprint, resulting in relatively high production costs. The applicant adds the movable cassette conveying device 12 to convey the cassette 7, thereby adding a console 6. The newly added console 6 can provide higher conveying efficiency without requiring adding a conveying system, thereby reducing costs and achieving advantages such as simple construction and a small footprint.

In this embodiment, optionally, the display panel conveying system includes:

a conveying platform 13, where the crane 11 or the movable cassette conveying device 12 fetches and conveys the cassette 7 from the conveying platform 13; or the crane 11 carries the cassette 7 to the conveying platform 13 and the crane 11 or the movable cassette conveying device 12 conveys the cassette 7 from the conveying platform 13 to the console 6.

When no new console 6 is added, the conveying platform 13 mainly provides a cassette inbound/outbound conveying system, and the newly added console 6 conveys the cassette 7 to the console 6 by still using the existing conveying system 13. The existing conveying system 13 is used and no console is added. Therefore, a footprint is reduced and costs are reduced without affecting normal running of the conveying system. In this embodiment, optionally, the conveying platform 13 includes a conveying apparatus 16, configured to convey the cassette 7 to a feed inlet of the movable cassette conveying device 12.

In this embodiment, optionally, the conveying platform 13 includes a conveying apparatus 16, configured to convey the cassette 7 to a feed inlet of the movable cassette conveying device 12.

The conveying apparatus 16 may be implemented by using a conveyor belt or a rail cart.

The cassette 7 can be conveyed to the movable cassette conveying device 12 by using the conveying apparatus 16 in the existing conveying platform 13. In this way, the cassette 7 is transferred to the movable cassette conveying device 12 without requiring adding a conveying channel.

In this embodiment, optionally, the display panel conveying system includes storage location space 10, configured to store the cassette 7, where the movable cassette conveying device 12 may convey the cassette 7 to the storage location space 10 or the console 6.

The movable cassette conveying device 12 may convey the cassette 7 to the console 6 for a next process, or may convey the cassette 7 to the storage location space 10 for storage. These two functions are provided, enabling high operability.

In this embodiment, optionally, the display panel conveying system includes a rail 9, where the movable cassette conveying device 12 moves on the rail 9; and the movable cassette conveying device 12 includes an overhead cassette conveyor 15, where the overhead cassette conveyor 15 has only one layer of storage locations for storing the cassette 7.

The overhead cassette conveyor 15 has only one layer of storage locations for storing the cassette 7. Usually, display panels 8 are stored in a stacking manner in the cassette 7 so that the cassette 7 has a specific height. Space of the overhead cassette conveyor 15 is limited and is insufficient for two or more layers of storage locations. Therefore, only one layer of storage location space 10 is designed, to achieve a better moving effect. Moreover, generally, 30 layers of display panels 8 may be stacked in the 7 cassette. If cassettes 7 are further stacked, fetching a display panel 8 from a cassette 7 by the console 6 may be affected.

In this embodiment, optionally, the console 6 includes:

a cassette placement platform 17, configured to temporarily store the cassette 7 conveyed by the crane 11 or the movable cassette conveying device 12; and a mechanical arm 14, configured to fetch the display panel 8 from the cassette 7; where the console 6 includes at least two cassette placement platforms 17.

The at least two cassette placement platforms 17 can ensure that the cassette 7 conveyed by the crane 11 or the movable cassette conveying device 12 can be stored on one cassette placement platform 17, and the mechanical arm can fetch a display panel from a cassette on the other cassette placement platform 17. The operations are performed synchronously, thereby improving working efficiency.

In this embodiment, optionally,

The display panel conveying system includes a conveying platform 13, a rail 9, and storage location space 10, where: the console 6 includes a first console 1 and a second console 2; the second console 2 is located on two sides of the crane 11; the conveying platform 13, the crane 11, and the storage location space 10 are located on one side of the rail 9; the conveying platform 13 is located between the crane 11 and the storage location space 10; the first console 1 is located on the other side of the rail 9; the movable cassette conveying device 12 is located on the rail 9; and the movable cassette conveying device 12 conveys the cassette from the conveying platform 13 to the first console 1.

The rail 9 and the movable cassette conveying device 12 are added on one side of the crane 11, the storage location space 10, and the conveying platform 13. When console space on two sides of the crane 11 is full, a new console 6 is added and a new conveying route is also provided, thereby increasing conveying and operation space for the cassette 7. The movable cassette conveying device 12 is located between the console 6 and conveying platform 13, so that the cassette 7 can be moved more conveniently from the conveying platform 13 to the console 6 for a next operation.

Figures 4, 5:
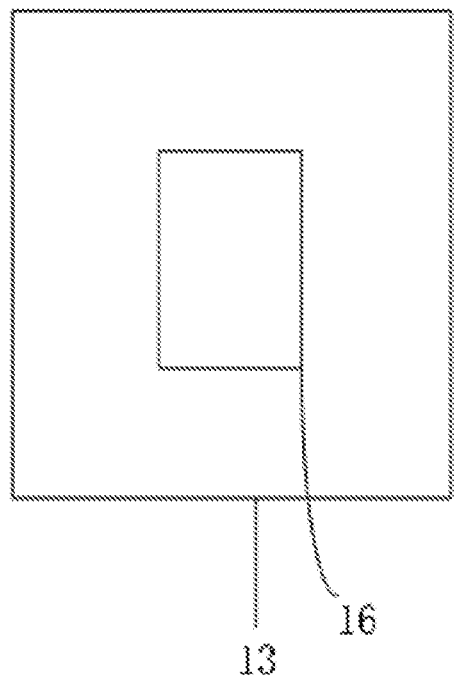
FIG. 4 is a schematic diagram of a conveying platform according to an embodiment of the present application.
FIG. 5 is a schematic diagram of steps of a conveying method of a conveying system according to an embodiment of the present application.

In another embodiment of the present application, as shown in FIG. 5, a conveying method of a display panel conveying system is disclosed, including the following steps:

S51: A crane 11 places a cassette 7 on a conveying platform 13.

S52. The conveying platform 13 moves the cassette 7 to a grabbing location of a movable cassette conveying device 12.

S53. The movable conveying device stores the cassette 7 on a console 6 or storage location space.

The cassette 7 is conveyed by the movable cassette conveying device 12. In this way, the cassette 7 can be conveyed to a newly added console 6 without requiring adding a conveying system. In addition, the newly added console 6 can provide higher conveying efficiency. This saves costs, directly improves a speed of conveying the cassette 7, and indirectly improves working efficiency, thereby achieving advantages such as simple construction and a small footprint.

In this embodiment, optionally, the conveying platform 13 conveys the cassette 7 to the movable cassette conveying device by using a conveying apparatus 16, where the movable cassette conveying device includes an overhead cassette conveyor 15.

The overhead cassette conveyor 15 is mountable, and is implementable for this method. The overhead cassette conveyor 15 does not affect a footprint of a display panel conveying system and has the advantage of low costs.

The panel in the present invention may be a TN panel (Twisted Nematic, that is, a twisted nematic panel), an IPS panel (In-Plane Switching), or a VA panel (Multi-domain Vertical Alignment); and certainly may be a panel of another type provided that the panel is applicable.

The foregoing content further describes the present application in detail with reference to specific preferred embodiments. It should not be considered that specific implementations of the present invention are limited to these descriptions. A person with ordinary skills in the art of the present invention may further make several simple deductions or replacements without departing from the concept of the present invention. All such deductions and replacements fall within the protection scope of the present application.

What is claimed is:

1. A display panel conveying system, comprising:
a cassette, configured to store a display panel;
a console, configured to temporarily store the cassette, fetch the display panel from the cassette, and place the display panel on a next working platform;
a crane, configured to convey the cassette to the console; and
a movable cassette conveying device, configured to fetch the cassette and place the cassette on the console, wherein
a conveying platform, wherein the crane or the movable cassette conveying device fetches and conveys the cassette from the conveying platform;
storage location space, configured to store the cassette; and
a rail, wherein the movable cassette conveying device moves on the rail, wherein
the console comprises a first console and a second console;
the first console comprises a first cassette placement platform, a second cassette placement platform, and a third cassette placement platform;
the second console is located on two sides of the crane; the conveying platform, the crane, and the storage location space are located on one side of the rail; the conveying platform is located between the crane and the storage location space; the first console is located on the other side of the rail; and the movable cassette conveying device is located on the rail; and
the conveying platform comprises a conveying apparatus, configured to convey the cassette to a feed inlet of the movable cassette conveying device.

2. A display panel conveying system, comprising:
a cassette, configured to store a display panel;
a console, configured to temporarily store the cassette, fetch the display panel from the cassette, and place the display panel on a next working platform;
a crane, configured to convey the cassette to the console; and
a movable cassette conveying device, configured to fetch the cassette and place the cassette on the console, wherein
the console comprises at least two sets;
wherein the display panel conveying system further comprises a rail, and the movable cassette conveying device is configured to move on the rail, and wherein the movable cassette conveying device comprises an overhead cassette conveyor, which comprises only one layer of storage locations for storing the cassette.

3. The display panel conveying system according to claim 2, comprising:
a conveying platform, wherein the crane or the movable cassette conveying device is configured to fetch and convey the cassette from the conveying platform; and
the crane is configured to carry the cassette to the conveying platform and the movable cassette conveying device is configured to convey the cassette from the conveying platform to the console.

4. The display panel conveying system according to claim 3, wherein the conveying platform comprises a conveying apparatus configured to convey the cassette to a feed inlet of the movable cassette conveying device.

5. The display panel conveying system according to claim 4, wherein the conveying apparatus comprises a conveyor belt.

6. The display panel conveying system according to claim 2, comprising a storage location space configured to store the cassette, and wherein the movable cassette conveying device is configured to convey the cassette to the storage location space or the console.

7. The display panel conveying system according to claim 2, wherein the console comprises:
a cassette placement platform, configured to temporarily store the cassette conveyed by the crane or the movable cassette conveying device; and
a mechanical arm, configured to fetch a display panel from the cassette; wherein
the console comprises at least two cassette placement platforms.

8. The display panel conveying system according to claim 2, comprising a conveying platform and a storage location space, wherein: the console comprises a first console and a second console; the second console is disposed on two sides of the crane; the conveying platform, the crane, and the storage location space are disposed on one side of the rail; the conveying platform is disposed between the crane and the storage location space; the first console is disposed on the other side of the rail; the movable cassette conveying device is located on the rail; and the movable cassette conveying device is configured to convey the cassette from the conveying platform to the first console.

9. A conveying method of a display panel conveying system, wherein the conveying system comprises:
a cassette, configured to store a display panel;
a console, configured to temporarily store the cassette, fetch the display panel from the cassette, and place the display panel on a next working platform;
a crane, configured to convey the cassette to the console; and
a movable cassette conveying device, configured to fetch the cassette and place the cassette on the console, wherein
the console comprises at least two sets; and
the conveying method comprises:
placing the cassette on a conveying platform by the crane;
moving the cassette to a grabbing location of the movable cassette conveying device by the conveying platform; and
storing the cassette on the console or a storage location space by the movable cassette conveying device;
wherein the display panel conveying system further comprises a rail, and the movable cassette conveying device is configured to move on the rail, and wherein the movable cassette conveying device comprises an overhead cassette conveyor, which comprises only one layer of storage locations for storing the cassette.

10. The conveying method of the display panel conveying system according to claim 9, wherein the operation of moving the cassette to the grabbing location of the movable cassette conveying device by the conveying platform comprises: moving the cassette to the movable cassette conveying device, by the conveying platform using a conveying apparatus, wherein the movable cassette conveying device comprises an overhead cassette conveyor.

11. The conveying method of the display panel conveying system according to claim 10, wherein the conveying platform comprises the conveying apparatus configured to convey the cassette to a feed inlet of the movable cassette conveying device.

12. The conveying method of the display panel conveying system according to claim 11, wherein the conveying apparatus comprises a conveyor belt.

13. The conveying method of the display panel conveying system according to claim 9, wherein the display panel conveying system comprises a storage location space, configured to store the cassette, and wherein the movable cassette conveying device is configured to convey the cassette to the storage location space or the console.

14. The conveying method of the display panel conveying system according to claim 9, wherein the console comprises:
a cassette placement platform, configured to temporarily store the cassette conveyed by the crane or the movable cassette conveying device; and
a mechanical arm, configured to fetch a display panel from the cassette; wherein
the console comprises at least two cassette placement platforms.

15. The conveying method of the display panel conveying system according to claim 9, wherein the display panel conveying system comprises a conveying platform and a storage location space, wherein the console comprises a first console and a second console; the second console is disposed on two sides of the crane; the conveying platform, the crane, and the storage location space are disposed on one side of the rail; the conveying platform is disposed between the crane and the storage location space; the first console is disposed on the other side of the rail; the movable cassette conveying device is located on the rail; and the movable cassette conveying device is configured to convey the cassette from the conveying platform to the first console.

* * * * *